(12) United States Patent
Schwartz et al.

(10) Patent No.: US 11,037,012 B2
(45) Date of Patent: Jun. 15, 2021

(54) IMAGE ACQUISITION SYSTEM

(71) Applicant: ISORG, Limoges (FR)

(72) Inventors: Wilfrid Schwartz, Limoges (FR);
Agathe Puszka, Limoges (FR);
Quentin Chable, Limoges (FR);
Benjamin Bouthinon, Limoges (FR)

(73) Assignee: ISORG, Limoges (FR)

( * ) Notice: Subject to any disclaimer, the term of this patent is extended or adjusted under 35 U.S.C. 154(b) by 0 days.

(21) Appl. No.: 16/491,830

(22) PCT Filed: Mar. 6, 2018

(86) PCT No.: PCT/FR2018/050516
§ 371 (c)(1),
(2) Date: Sep. 6, 2019

(87) PCT Pub. No.: WO2018/162842
PCT Pub. Date: Sep. 13, 2018

(65) Prior Publication Data
US 2020/0380282 A1 Dec. 3, 2020

(30) Foreign Application Priority Data

Mar. 6, 2017 (FR) ........................................ 1751789
Aug. 11, 2017 (FR) ........................................ 1757669

(51) Int. Cl.
*G06F 3/042* (2006.01)
*G06K 9/20* (2006.01)
(Continued)

(52) U.S. Cl.
CPC ............. *G06K 9/209* (2013.01); *G06F 3/042* (2013.01); *G06K 9/0004* (2013.01);
(Continued)

(58) Field of Classification Search
CPC ........ G06F 3/042; G06F 3/0421; G06F 3/044; G06F 3/0414
See application file for complete search history.

(56) References Cited

U.S. PATENT DOCUMENTS 9,559,239 B2 * 1/2017 Yamamoto ........ H01L 27/14678
9,904,839 B2 * 2/2018 Sun ...................... G06K 9/0004
(Continued)

FOREIGN PATENT DOCUMENTS

EP 2657929 A2 10/2013
FR 2996933 A1 4/2014
(Continued)

OTHER PUBLICATIONS

Authorized Officer: Lauri, Lauro, International Search Report issued in counterpart PCT application No. PCT/FR2018/050516, dated Jun. 4, 2018, 3 pp.
(Continued)

*Primary Examiner* — Vijay Shankar
(74) *Attorney, Agent, or Firm* — Kaplan Breyer Schwarz, LLP

(57) ABSTRACT

An image acquisition system includes a source of a radiation, an image sensor including an array of photodetectors capable of detecting the radiation and including a surface, and an angular filter, covering the sensor, and capable of blocking the rays of the radiation having an incidence relative to a direction orthogonal to the surface greater than a threshold and of giving way to at least certain rays of the radiation having an incidence relative to a direction orthogonal to the surface smaller than the threshold.

29 Claims, 8 Drawing Sheets

(51) Int. Cl.
*G06K 9/00* (2006.01)
*H01L 27/28* (2006.01)
*H01L 27/30* (2006.01)
*H01L 27/32* (2006.01)

(52) U.S. Cl.
CPC .......... *H01L 27/288* (2013.01); *H01L 27/307* (2013.01); *H01L 27/323* (2013.01); *H01L 27/3244* (2013.01); *G06F 2203/04103* (2013.01)

(56) References Cited

U.S. PATENT DOCUMENTS

| | | | |
|---|---|---|---|
| 10,535,721 B2 * | 1/2020 | Puszka | H01L 27/3227 |
| 10,782,809 B2 * | 9/2020 | Schwartz | G06F 3/0412 |
| 2008/0007542 A1 | 1/2008 | Eliasson et al. | |
| 2009/0185722 A1 | 7/2009 | Kajihara et al. | |
| 2010/0264297 A1 | 10/2010 | Kurahashi | |
| 2013/0033601 A1 | 2/2013 | Kim et al. | |
| 2015/0187980 A1 * | 7/2015 | Yamamoto | G06K 9/00087 250/552 |
| 2015/0293661 A1 | 10/2015 | Gomez | |
| 2016/0328595 A1 * | 11/2016 | Sun | H01L 27/1469 |
| 2017/0062643 A1 | 3/2017 | Segura-Puchades | |

FOREIGN PATENT DOCUMENTS

| | | |
|---|---|---|
| FR | 3040577 A1 | 3/2017 |
| WO | 2017/024850 A1 | 2/2017 |

OTHER PUBLICATIONS

Search Report issued in French counterpart patent application No. 17/57669, dated Sep. 5, 2019, 3 pp.
Search Report issued in French counterpart patent application No. 17/51789, dated Aug. 7, 2017, 2 pp.
Written Opinion of the International Searching Authority issued in corresponding PCT application No. PCT/FR2018/050516, dated Jun. 4, 2018, 5 pp.

* cited by examiner

IMAGE ACQUISITION SYSTEM

The present patent application claims the priority benefit of French patent applications FR17/51789 and FR17/57669 the content of which is hereby incorporated by reference in its entirety to the maximum extent allowable by law.

BACKGROUND

The present disclosure concerns an image acquisition system.

DISCUSSION OF THE RELATED ART

An image acquisition system generally comprises an image sensor and an optical system, interposed between the sensitive portion of the image sensor and the object to be imaged and which enables to form a sharp image of the object to be imaged on the sensitive portion of the image sensor.

However, in some cases, it is not possible to have such an optical system between the sensitive portion of the image sensor and the object to be imaged. This is particularly true when the image sensor occupies a significant surface area, greater than one square centimeter, and the distance between the object to be imaged and the sensitive portion of the image sensor is smaller than one centimeter.

The object to be imaged would then have to be placed at closest to the image sensor so that the image which forms on the sensitive portion of the image sensor is sufficiently sharp. However, there may be a distance between the object and the image sensor, so that the sharpness of the image which forms on the sensitive portion of the image sensor may be insufficient for certain applications, for example, for example, for the capture of fingerprints.

SUMMARY

An object of an embodiment is to increase the sharpness of the image acquired by the image sensor of an image acquisition system in the absence of an optical system forming a sharp image of the object to be imaged on the sensitive portion of the image sensor.

Another object of an embodiment is for the surface area of the sensitive portion of the image sensor to be greater than one square centimeter.

Another object of an embodiment is for the distance between the object to be imaged and the sensitive portion of the image sensor to be shorter than one centimeter.

Another object of an embodiment is for the distance between the object to be imaged and the sensitive portion of the image sensor to be greater than fifty micrometers.

Thus, an embodiment provides an image acquisition system comprising:
  a source of a radiation;
  an image sensor comprising an array of photodetectors capable of detecting said radiation and comprising a surface; and
  an angular filter, covering the image sensor, and capable of blocking the rays of said radiation having an incidence relative to a direction orthogonal to the surface greater than a threshold and of giving way to rays of said radiation having an incidence relative to a direction orthogonal to the surface smaller than the threshold.

According to an embodiment, the system further comprises a coating at least partially transparent to said radiation and covering the image sensor, the angular filter being interposed between the coating and the image sensor.

According to an embodiment, the source is capable of emitting said radiation into the coating from the periphery of the coating, the coating playing the role of a waveguide for said radiation.

According to an embodiment, the radiation is in the visible range and/or in the infrared range.

According to an embodiment, the angular filter comprises an array of holes delimited by walls opaque to said radiation or made of a polarizing material, the holes being filled with air or with a material at least partially transparent to said radiation.

According to an embodiment, for each hole, the ratio of the height of the hole, measured perpendicularly to the surface, to the width of the hole, measured parallel to the surface, varies from 1 to 10.

According to an embodiment, the holes are arranged in rows and in columns, the pitch between adjacent holes of a same row or of a same column varying from 10 µm to 30 µm.

According to an embodiment, the height of each hole, measured along a direction orthogonal to the surface, varies from 1 µm to 1 mm.

According to an embodiment, the width of each hole, measured parallel to the surface, varies from 5 µm to 30 µm.

According to an embodiment, the walls are entirely made of a material opaque to said radiation.

According to an embodiment, each wall comprises a core made of a material transparent to said radiation covered with a layer opaque to said radiation.

According to an embodiment, the system further comprises lenses covering the holes.

According to an embodiment, the system comprises, for each hole, a lens covering the hole and in contact with the walls.

According to an embodiment, the photodetectors comprise organic photodiodes.

An embodiment provides a display system comprising the image acquisition system such as previously defined and further comprising a display screen, the angular filter being interposed between the display screen and the image sensor.

According to an embodiment, the display screen comprises an array of light-emitting components and the photodetectors are offset with respect to the light-emitting components along a direction perpendicular to the surface.

According to an embodiment, the light-emitting components are separated from one another by intermediate areas and the photodetectors are located in line with said intermediate areas along a direction perpendicular to said surface.

According to an embodiment, the display screen comprises an array of light-emitting components, the light-emitting components are at least partly transparent to the radiation and the light-emitting components are located at least partly opposite the photodetectors along a direction perpendicular to said surface.

According to an embodiment, the light-emitting components comprise organic light-emitting diodes.

An embodiment also provides using the display system such as previously defined for the detection of at least one fingerprint of a user.

An embodiment also provides a method of manufacturing an image acquisition system, comprising the steps of:
  providing a source of a radiation;
  forming an image sensor comprising an array of photodetectors capable of detecting said radiation and comprising a surface; and forming an angular filter, covering the image sensor, and capable of blocking the rays of said radiation having an incidence relative to a direction orthogonal to the surface greater than a threshold and of giving way to rays of said radiation having an incidence relative to a direction orthogonal to the surface smaller than the threshold.

According to an embodiment, the angular filter comprises an array of holes delimited by walls opaque to said radiation, the forming of the angular filter comprising the steps of:
forming a layer of a resist; and
forming the walls by etching of the layer by photolithography.

According to an embodiment, the resist is a black or colored resin.

According to an embodiment, the angular filter comprises an array of holes delimited by walls opaque to said radiation, the forming of the angular filter comprising the steps of:
forming a transparent resin mold, by photolithography steps, having a shape complementary to the desired shape of the walls;
filling the mold with the material forming the walls; and
removing the obtained structure from the mold.

According to an embodiment, the angular filter comprises an array of holes delimited by walls opaque to said radiation, each wall comprising a core made of a material transparent to said radiation covered with a layer opaque to said radiation, the forming of the angular filter comprising the steps of:
forming a layer of a resist transparent to said radiation;
etching the layer by photolithography according to the desired shape of the walls; and
covering the obtained structure with the layer opaque to said radiation.

According to an embodiment, the forming of the angular filter comprises piercing holes of micrometer-range size in a black or colored film.

According to an embodiment, the holes are pierced by means of needles of micrometer-range size.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
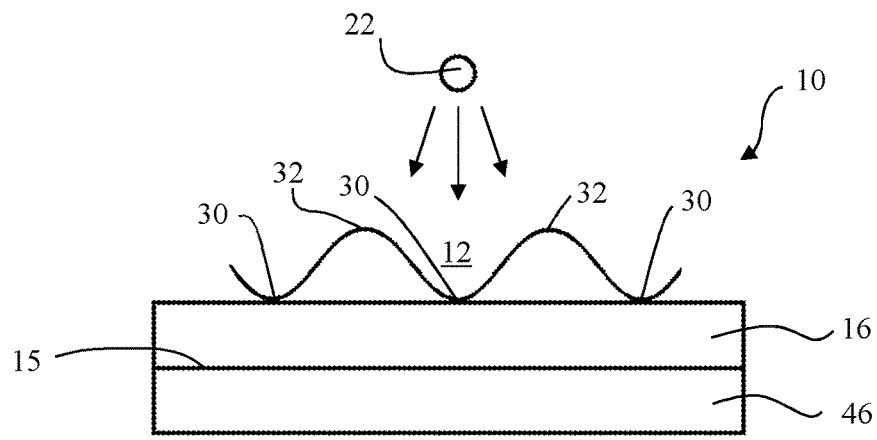
FIGS. 1 and 2 are partial simplified cross-section views of embodiments of an image acquisition system.

For clarity, the same elements have been designated with the same reference numerals in the various drawings and, further, as usual in the representation of electronic circuits, the various drawings are not to scale. In the following description, when reference is made to terms qualifying absolute positions, such as terms "front", "rear", "top", "bottom", "left", "right", etc., or relative positions, such as terms "above", "under", "upper", "lower", etc., it is referred to the orientation of the drawings or to an image acquisition system or a display system in a normal position of use.

Further, only those elements which are useful to the understanding of the present description have been shown and will be described.

In particular, what use is made of the sensors described hereafter has not been detailed and what use is made of the display systems described hereafter comprising a display screen and an image sensor has not been detailed. It will be within the abilities of those skilled in the art to use the display systems in any type of system capable of being controlled via a touch interface. Further, the structure of an image acquisition system or of a display screen is well known by those skilled in the art and will not be described in detail hereafter. Further, the means for processing the signals supplied by the image acquisition systems described hereafter are within the abilities of those skilled in the art and will not be described. The terms "substantially", "approximately", and "in the order of" are used herein to designate a tolerance of plus or minus 10% of the value in question. In the case of an angle, the terms "substantially" and "approximately" are used herein to designate a tolerance of plus or minus 10° of the value in question.

In the following description, "visible light" designates an electromagnetic radiation having a wavelength in the range from 400 nm to 700 nm and "infrared radiation" designates an electromagnetic radiation having a wavelength in the range from 700 nm to 1 mm. In infrared radiation, one can particularly distinguish near infrared radiation having a wavelength in the range from 700 nm to 1.4 μm.

A pixel of an image corresponds to the unit element of the image displayed by a display screen. When the display screen is a color image display screen, it generally comprises, for the display of each image pixel, at least three emission and/or light intensity regulation components, also called display sub-pixels, which each emit a light radiation substantially in a single color (for example, red, green, and blue). The superposition of the radiations emitted by the three display sub-pixels provides the observer with the color sensation corresponding to the pixel of the displayed image.

In this case, the assembly formed by the three sub-display pixels used to display a pixel of an image is called display pixel of the display screen.

FIG. 1 is a partial simplified cross-section view of an embodiment of a system 10 for acquiring images of an object 12, partially shown in FIG. 1. Image acquisition system 10 comprises, from bottom to top in FIG. 1:
- an image sensor 14 having an upper surface 15;
- an angular filter 16; and
- a light source 22.

Image acquisition system 10 further comprises means, not shown, for processing the signals output by image sensor 14, for example comprising a microprocessor.

Figure 2:
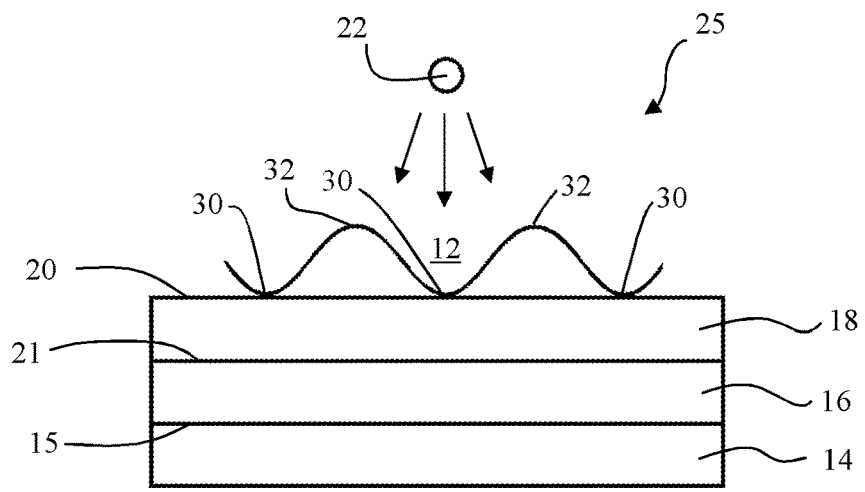

FIG. 2 is a partial simplified cross-section view of another embodiment of a system 25 for acquiring images of object 12. Image acquisition system 25 comprises all the elements of image acquisition system 10 and further comprises a coating 18 having opposite upper and lower surfaces 20, 21 covering angular filter 16 on the side opposite to image sensor 14.

Figure 3:
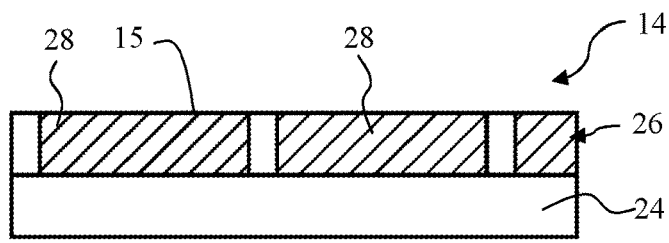
FIG. 3 is a cross-section view of an embodiment of an image sensor of the image acquisition system of FIG. 2.

FIG. 3 is a cross-section view of an embodiment of image sensor 14. Image sensor 14 comprises a support 24 and an array 26 of photon sensors 28, also called photodetectors, arranged between support 24 and angular filter 16. Photodetectors 28 may be covered with a transparent protective coating, not shown. Image sensor 14 further comprises conductive tracks and switching elements, particularly transistors, not shown, enabling to select photodetectors 28. Photodetectors 28 may be made of organic materials. Photodetectors 28 may correspond to organic photodiodes (OPD) or to organic photoresistors. The surface area of image sensor 14 opposite angular filter 16 and containing photodetectors 28 is greater than 1 cm$^2$, preferably greater than 5 cm$^2$, more preferably greater than 10 cm$^2$, in particular greater than 20 cm$^2$. Surface 15 may be substantially planar.

Coating 18 is at least partially transparent to the radiation emitted by light source 22. Coating 18 may have a thickness in the range from 1 μm to 10 mm. Upper surface 20 and lower surface 21 may be substantially planar.

Angular filter 16 is capable of filtering the incident radiation according to the incidence of the radiation relative to upper surface 20 of angular filter 16, particularly so that each photodetector 28 receives only the rays having an incidence relative to an axis perpendicular to upper surface 20 of angular filter 16 smaller than a maximum angle of incidence smaller than 45°, preferably smaller than 30°, more preferably smaller than 20°, more preferably still smaller than 10°. Angular filter 16 is capable of blocking the rays of the incident radiation having an incidence relative to an axis perpendicular to upper surface 20 of angular filter 16 greater than the maximum angle of incidence.

In the embodiment shown in FIG. 1 or 2, the object 12 having its image acquired by image sensor 14 is interposed between light source 22 and angular filter 16 or coating 18. The image is obtained by transmission of the radiation emitted by light source 22 through object 12. The radiation emitted by source 22 may be a visible radiation and/or an infrared radiation. For an application for the determination of fingerprints, object 12 corresponds to a user's finger. Preferably, finger 12 is in contact with upper surface 20 of image acquisition system 10 so that the light rays crossing contact areas 30 between object 12 and surface 20 are strongly transmitted while the light rays crossing areas without contact, also called valleys, are more lightly transmitted. The photodetectors 28 located opposite contact areas 30 collect the light scattered at a low incidence while the photodetectors 28 located opposite the areas 32 without contact collect little light since the latter is mostly blocked by angular filter 16.

Figure 4:
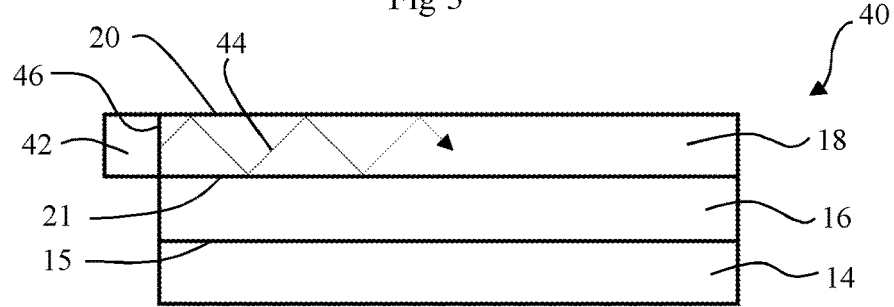
FIG. 4 is a partial simplified cross-section view of another embodiment of an image acquisition system.

FIG. 4 is a partial simplified cross-section view of another embodiment of an image acquisition system 40. Image acquisition system 40 comprises all the elements of image acquisition system 25 shown in FIG. 2 with the difference that light source 22 is replaced with a light source 42 capable of emitting a light radiation 44 into coating 18, which then plays the role of a waveguide. The radiation 44 emitted by source 42 may be a visible radiation and/or an infrared radiation. Radiation 44 is injected into coating 18 from the periphery of coating 18. In the embodiment shown in FIG. 4, radiation 44 is injected into coating 18 from a lateral edge 46 of coating 18. According to another embodiment, radiation 44 is injected into coating 18 at the periphery of coating 18 from upper surface 20 or lower surface 21, preferably from lower surface 21. In the present embodiment, coating 18 preferably has a thickness in the range from 0.1 mm to 1 mm. Coating 18 may be made of glass or of a plastic material.

According to an embodiment, it is possible for the beam 44 emitted by source 42 and propagating into coating 18 not to be collimated. According to an embodiment, the beam 44 emitted by source 42 and propagating into coating 18 is substantially collimated, the rays of beam 44 being substantially parallel to surfaces 20, 21 of coating 18. This may enable to improve the homogeneity of the image of the contact areas 30 acquired by image sensor 14.

Figure 5:
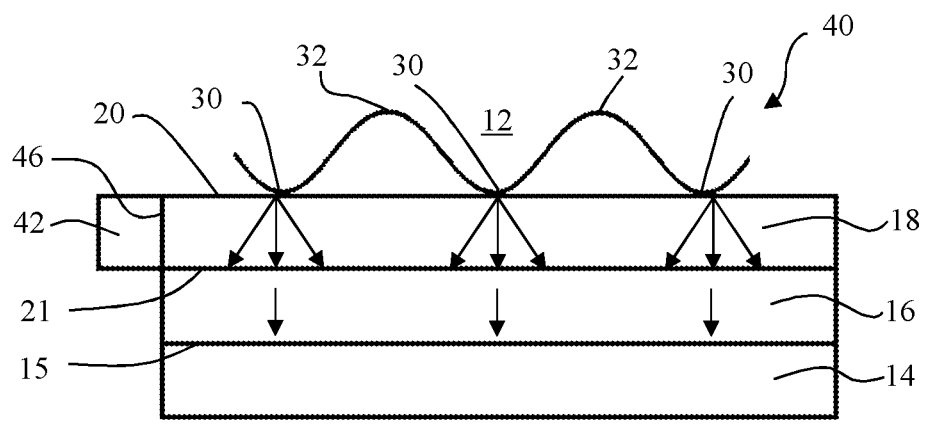
FIGS. 5 and 6 are cross-section views similar to FIG. 4 illustrating the operation of the image acquisition system of FIG. 4 used as a fingerprint sensor.
Figure 6:
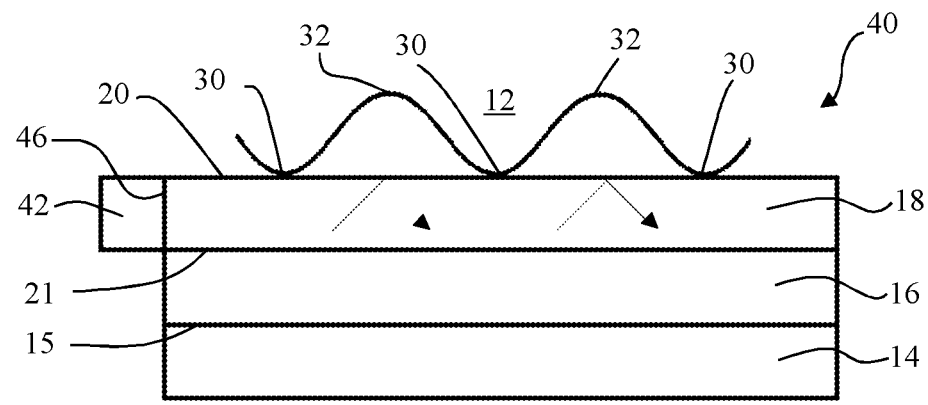

FIGS. 5 and 6 illustrate the operation of image acquisition system 40 as a fingerprint sensor. As shown in FIG. 5, the radiation which propagates into coating 18 is diffused at the level of the contact areas 30 between object 12 and upper surface 20 so that the photodetectors 28 of image sensor 14 opposite the contact areas receive the scattered radiation filtered by angular filter 16. As shown in FIG. 6, the radiation which propagates into coating 18 remains confined in coating 18 at the level of valleys 32 so that the photodetectors 28 of image sensor 14 opposite valleys 32 receive little or no radiation.

Another example of application of image acquisition system 10 or 40 relates to the acquisition of images of a biological material through a transparent support having the biological material placed therein, for example, a biological culture placed in a Petri dish.

Figure 7:
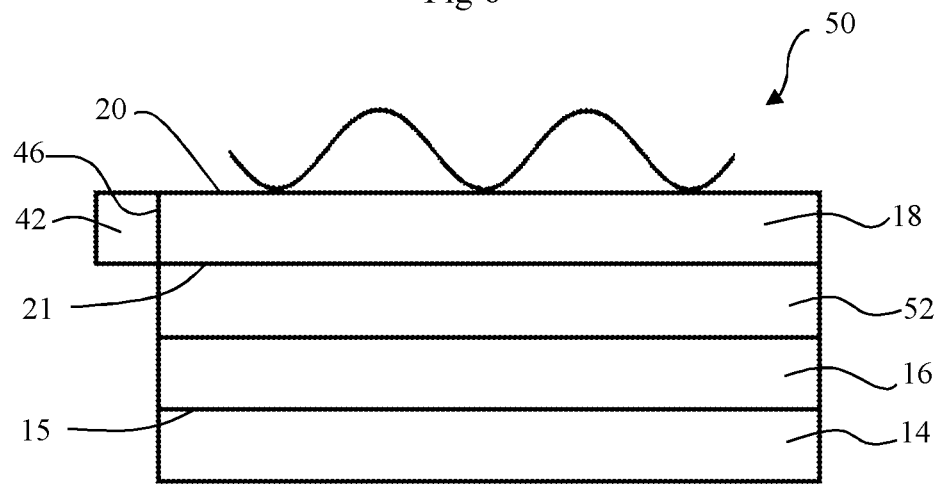
FIG. 7 is a partial simplified top view of an embodiment of a display system comprising a display screen and an image sensor.

FIG. 7 is a partial simplified cross-section view of an embodiment of a display system 50.

Display system 50 comprises all the elements of image acquisition system 40 shown in FIG. 4 and further comprises a display screen 52 interposed between coating 18 and angular filter 16. The array of light-emitting components 56 is arranged in a plane parallel to the array of photodetectors 28. The array of photodetectors 28 and the array of light-emitting components 56 are stacked with angular filter 16 interposed therebetween.

Figure 8A:
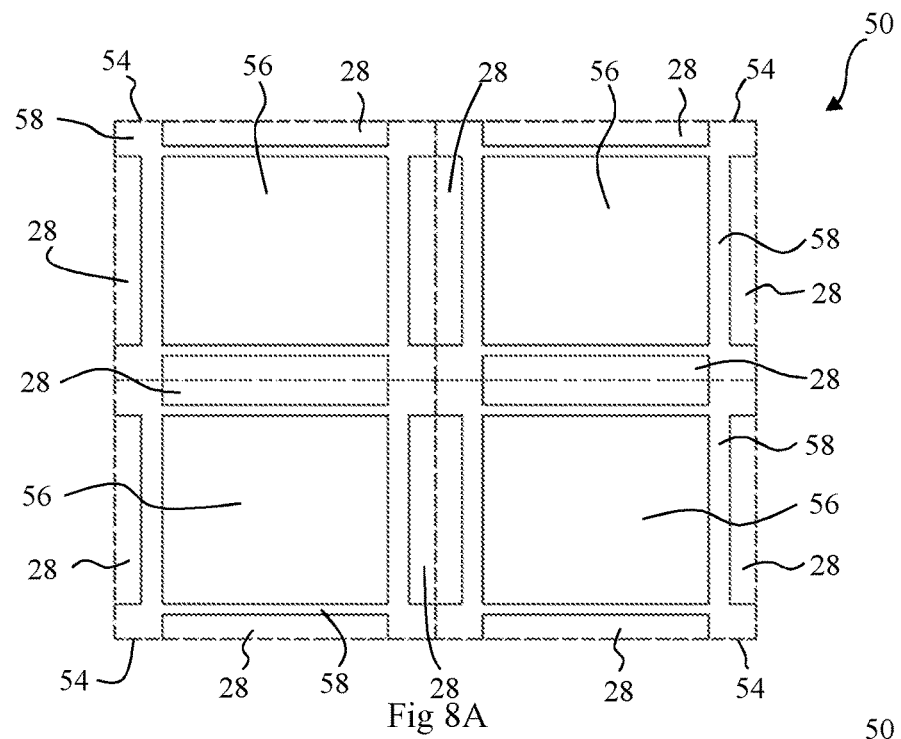
FIGS. 8A and 8B respectively are a top view and a cross-section view, partial and simplified, of an embodiment of a display system comprising a display screen and an image sensor.
Figure 8B:
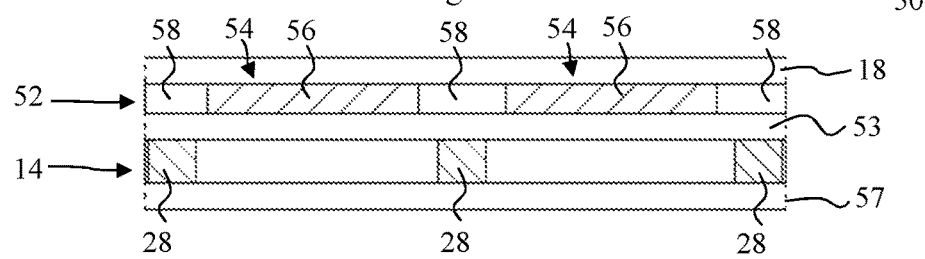

FIGS. 8A and 8B respectively are a top view and a cross-section view, partial and simplified, of a more detailed embodiment of display system 50.

Figure 9:
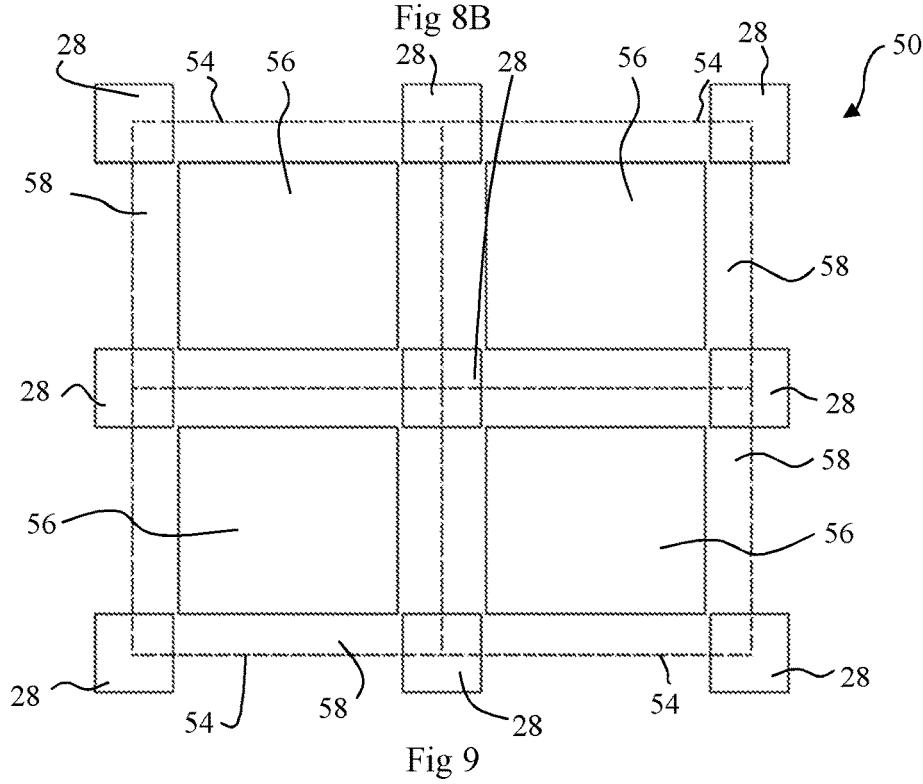
FIG. 9 is a partial simplified top view of another embodiment of a display system comprising a display screen and an image sensor.

FIG. 9 is a partial simplified top view of another embodiment of a display system comprising a display screen and an image sensor. Image sensor 14 rests on a support 53.

Display screen 52 comprises a first support 53 and an array of display sub-pixels 54 on support 53.

Display screen 52 comprises an array of display sub-pixels 54, only shown in FIGS. 8A and 9. Each display sub-pixel 54 comprises an optoelectronic component 56 capable of emitting an electromagnetic radiation, called light-emitting component in the rest of the disclosure. Each light-emitting component 56 for example corresponds to a light-emitting diode, particularly, to an organic light-emitting diode (OLED). Display sub-pixels 54 may further comprise conductive tracks and switching elements, particularly transistors, not shown, enabling to select the display sub-pixels.

Image sensor 14 comprises a second support 57 and an array of photon sensors, or photodetectors 28, arranged between support 57 and support 53. Angular filter 16, not shown in FIG. 8B, is interposed between image sensor 14 and display screen 52. Photodetectors 26 may be covered with a transparent protection coating, not shown. Image sensor 14 further comprises conductive tracks and switching elements, particularly transistors, not shown, enabling to select photodetectors 28.

In FIGS. 8A and 9, each display sub-pixel 54 is shows as being square and each light-emitting component 56 corresponds to a stack of layers having a substantially square shape. It should however be clear that the shape of display sub-pixel 54 and the shape of light-emitting component 56 may be different, for example, polygonal. In the present embodiment, in top view, the surface area occupied by light-emitting component 56 is smaller than the surface area of display sub-pixel 54 and each display sub-pixel 54 comprises an intermediate area 58 at least partly surrounding light-emitting component 56. In FIGS. 8A, 8B, and 9, angular filter 16 is not shown.

Display system 50 further comprises means, not shown, for processing the signals delivered by image sensor 14, for example comprising a microprocessor, and means, not shown, for controlling display screen 52.

The array of light-emitting components 56 is arranged in a plane parallel to the array of photodetectors 28. The array of photodetectors 28 and the array of light-emitting components 56 are stacked with angular filter 16 interposed therebetween.

According to an embodiment, a slight offset between the positions of light-emitting components 56 and of photodetectors 28 may be provided so that, in top view, light-emitting components 56 are not totally or partly opposite photodetectors 28, to avoid masking photodetectors 28. This embodiment is adapted to the case where light-emitting components 56 are not transparent for the radiation detected by image sensor 14 and where the intermediate areas 58 surrounding light-emitting components 56 at least partially give way to visible light and/or infrared light with a transmittance greater than 5%. According to an embodiment, photodetectors 28 are located, in top view, between the light-emitting components 56 of adjacent pixels.

In the layout shown in FIG. 8A, each photodetector 28 extends, in top view, along the common edge between two adjacent display sub-pixels 54. In the layout shown in FIG. 9, each photodetector 28 is located, in top view, in the corner common to four adjacent display sub-pixels 54.

According to an embodiment, the entire display screen 52 may have a low transmittance in the visible range. This may apply when display screen 52 is a liquid crystal display comprising a reflector on the back side of a backlighting unit. This may also apply for certain types of OLED screens. The radiation 44 emitted by source 42 may then be in a frequency range outside of the visible range for which display screen 52 is at least partially transparent, for example, in infrared.

According to another embodiment, in the case where light-emitting components 56 are at least partly transparent to the radiation captured by photodetectors 28, light-emitting components 56 may be located, in top view, partly or totally opposite photodetectors 28.

In the embodiment shown in FIG. 7, the radiation detected by image sensor 14 is that delivered by source 42 and may be in a wavelength range different from that of the radiation emitted by display screen 52. According to the embodiment shown in FIG. 8B, source 42 is not present. In this case, the radiation detected by the image sensor may correspond to the radiation emitted by light-emitting components 56 of display screen 52 or by some of them. In particular, for the fingerprint capture application, display screen 52 may emit a radiation which reflects on object 12, the reflected radiation being angularly filtered by angular filter 16 and detected by image sensor 14. According to an embodiment, for the fingerprint capture application, only light-emitting components 56 of display screen 52 emitting the same color, for example, blue light, are activated.

The pitch between photodetectors 28 of a same row of a same column substantially corresponds to the pitch of display sub-pixels 54 and is greater than 200 dpi, preferably in the range from 250 dpi to 2,000 dpi, more preferably in the range from 300 dpi to 2,000 dpi.

According to an embodiment, each photodetector 28 is capable of detecting an electromagnetic radiation in a wavelength range from 400 nm to 1,100 nm. Photodetectors 28 may be capable of detecting an electromagnetic radiation in the same wavelength range. As a variation, photodetectors 28 may be capable of detecting an electromagnetic radiation in different wavelength ranges.

Image sensor 14 is used to detect an actuating member, not shown, for example, a finger or a stylus, located on protection layer 18. According to an embodiment, the image of the actuation member seen by photodetectors 28 is used. According to an embodiment, the image of the actuation member is particularly formed by the reflection, on the actuation member, of the light ray emitted by display sub-pixels 54, in particular, the display sub-pixels 54 which are covered with the actuation member. According to another embodiment, the image of the actuation member is obtained from the detection of another electromagnetic radiation than the radiation emitted by display sub-pixels 54, particularly based on the detection of an infrared radiation.

According to an embodiment, image sensor 14 may be used to detect the fingerprint of at least one finger of a user. Preferably, image sensor 14 may be used to simultaneously detect the fingerprints of a plurality of fingers of the user. According to an embodiment, image sensor 14 may play the role of a touch surface, and display system 50 may then be used as an interactive user interface controllable by simple sliding of the finger or of the hand over the touch surface. Such an interactive user interface may particularly be used to control cells phones, computers, television sets, motor vehicles, automated ticketing machines, industrial equipment, medical equipment, etc.

In known fashion, each light-emitting component 56 may comprise a stack of layers comprising, in particular, between two electrodes, a hole transport layer (HTL), an emission layer (EML), an electron transport layer (ETL). By applying an appropriate electric voltage, electrons and holes are injected into the EML from the electrodes. The electrons and the holes recombine in the EML, causing the releasing of photons.

Figure 10:
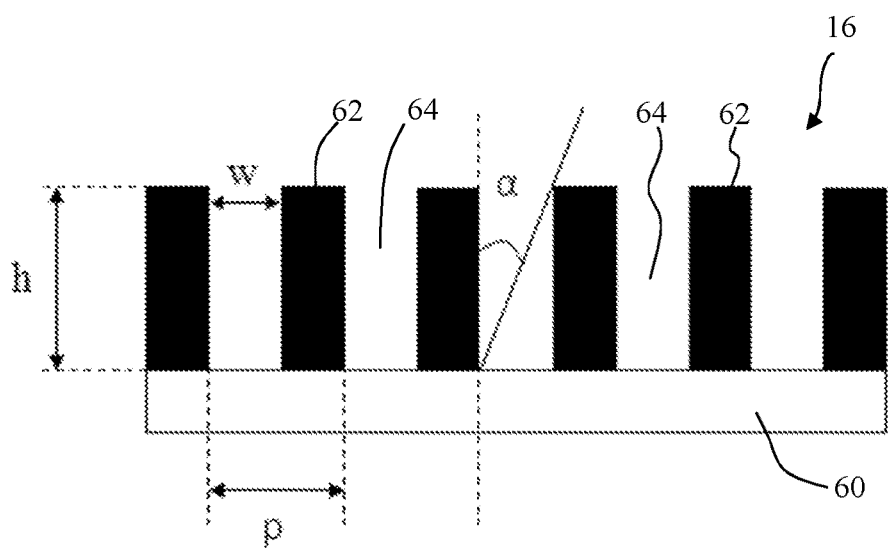
FIGS. 10 and 11 respectively are a cross-section view and a top view, partial and simplified, of an embodiment of an angular filter.
Figure 11:
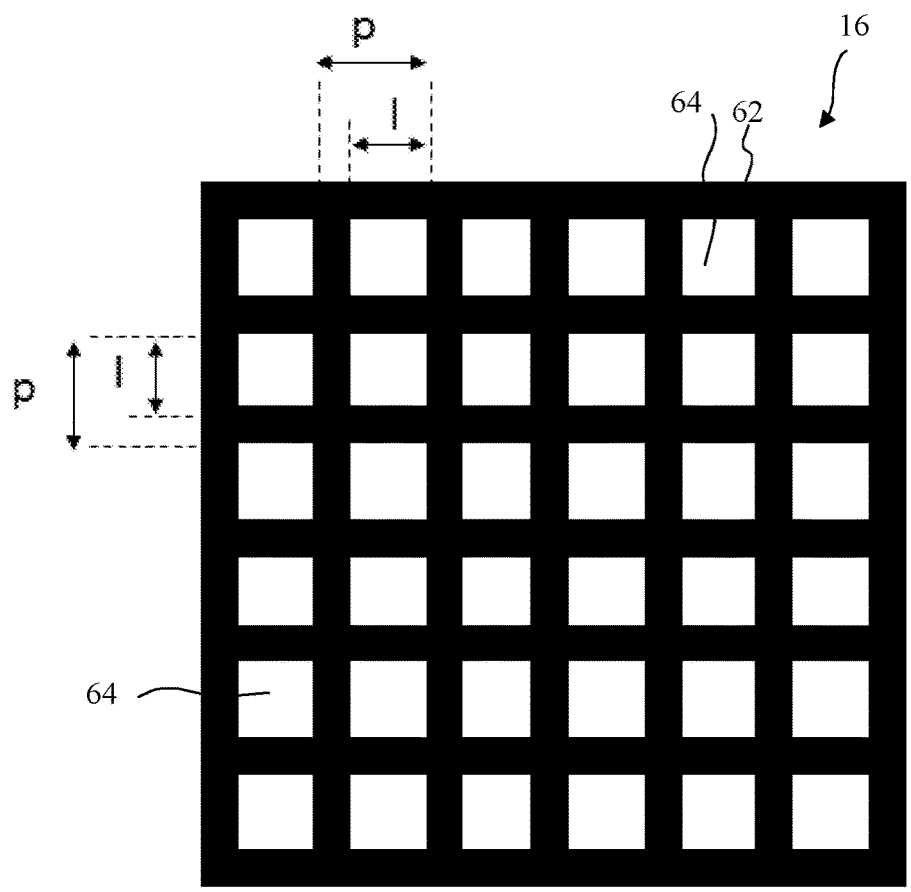

FIGS. 10 and 11 respectively are a cross-section view and a top view, partial and simplified, of an embodiment of angular filter 16.

In the present embodiment, angular filter 16 comprises a support 60 and walls 62 resting on support 60 and delimiting holes 64. Call "h" the height of walls 64 measured from support 60. Support 60 is made of a material at least partially transparent to the radiation captured by photodetectors 28. Walls 62 are opaque to the radiation detected by photodetectors 28, for example, absorbing and/or reflective with respect to the radiation detected by photodetectors 28. According to an embodiment, walls 62 are absorbing in the visible range and/or in near infrared and/or in the infrared range.

In FIG. 10, holes 64 are shown with a square cross-section. Generally, the cross-section of holes 64 in the top view may be circular, oval, or polygonal, for example, triangular, square, or rectangular.

According to an embodiment, holes 64 are arranged in rows and in columns. Holes 64 may have substantially the same dimensions. Call "w" the width of a hole 64 measured along the row or column direction. According to an embodiment, holes 64 are regularly arranged along the rows and along the columns. Call "p" the repetition pitch of holes 64, that is, the distance in top view of the centers of two successive holes 64 of a row or of a column.

The angular filter 16 shown in FIGS. 10 and 11 only gives way to the rays of the incident radiation having an incidence relative to support 60 smaller than a maximum angle of incidence α, which is defined by the following relation (1):

$$\tan \alpha = w/h \quad (1)$$

The smaller ratio w/h, the smaller the maximum angle of incidence α. The transmittance for a zero incidence of angular filter 16 is proportional to the ratio of the transparent surface area in top view to the absorbing surface area of angular filter 16. For applications at a low light level, it is desirable for the transmittance to be maximum to increase the quantity of light collected by image sensor 14. For applications at a high light level, the transmittance may be decreased to avoid dazzling image sensor 14.

According to an embodiment, photodetectors 28 may be distributed in rows and in columns. According to an embodiment, the pitch p of holes 64 is smaller than the pitch of the photodetectors 28 of image sensor 14. In this case, a plurality of holes 64 may be located opposite a photodetector 28. According to an embodiment, the pitch p of holes 64 is identical to the pitch of the photodetectors 28 of image sensor 14. Angular filter 16 is then preferably aligned with image sensor 14 so that each hole 64 is opposite a photodetector 28. According to an embodiment, the pitch p of holes 64 is larger than the pitch of the photodetectors 28 of image sensor 14. In this case, a plurality of photodetectors 28 may be located opposite a hole 64.

Ratio h/w may vary from 1 to 10. Pitch p may vary from 10 μm to 30 μm, and may for example be 15 μm. Height h may vary from 1 μm to 1 mm, preferably from 20 μm to 100 μm. Width w may vary from 5 μm to 30 μm, for example, approximately 10 μm.

Substrate 60 may be made of a transparent polymer, particularly made of poly(ethylene) terephthalate PET, poly(methyl) methacrylate PMMA, cyclic olefin polymer (COP). The thickness of substrate 60 may vary from 1 to 100. Substrate 60 may correspond to a colored filter, to a polarizer, to a half-wave plate or to a quarter-wave plate. Support 60 may further correspond to image sensor 14 or to a protection layer covering image sensor 14.

Holes 64 may be filled with air or filled with a material at least partially transparent to the radiation detected by photodetectors 28, for example polydimethylsiloxane (PDMS). As a variation, holes 64 may be filled with a partially absorbing material in order to chromatically filter the rays angularly filtered by angular filter 16. Angular filter 16 may then further play the role of a colored filter. This enables to decrease the thickness of the system with respect to the case where a colored filter different from angular filter 16 would be present. The partially absorbing filling material may be a colored resin or a colored plastic material such as PDMS.

The filling material of holes 64 may be adapted to have a refraction index matching with the upper layer in contact with angular filter 16 or to rigidify the structure and improve the mechanical resistance of angular filter 16.

In the embodiment illustrated in FIGS. 10 and 11, walls 62 are totally made of a material absorbing at least for the wavelengths to be angularly filtered. Walls 62 may be made of colored resin, for example, a colored or black SU-8 resin. As an example, walls 62 may be made of a black resin absorbing in the visible range and in near infrared. According to another example, walls 62 may be made of colored resin absorbing visible light of a given color, for example, blue light, in the case where source 42 emits light of a given color, in the case where source 42 is polychromatic and image sensor 14 is only sensitive to light of a given color or in the case where source 42 is polychromatic, where image sensor 14 is sensitive to visible light and a filter of the given color is interposed between angular filter 16 and the object to be detected.

An embodiment of a method of manufacturing the angular filter 16 shown in FIGS. 10 and 11 comprises the steps of:

deposition of a colored resin layer on support 60 having a thickness substantially equal to height h;

printing of the patterns of walls 62 in the resin layer by photolithography; and development of the resin layer to only keep walls 62.

Another embodiment of a method of manufacturing the angular filter 16 shown in FIGS. 10 and 11 comprises the steps of:

forming a transparent resin mold, by photolithography steps, having a shape complementary to the desired shape of walls 62;

filling the mold with the material forming walls 62; and removing the obtained structure from the mold.

Another embodiment of a method of manufacturing the angular filter 16 shown in FIGS. 10 and 11 comprises perforating a colored filter of height h, for example, a film made of PDMS, PMMA, PEC, COP. The perforation may be performed by using a micro-perforation tool for example comprising micro-needles to obtain the desired dimensions of holes 64 and pitch of holes 64.

According to an embodiment, angular filter 16 is directly formed on image sensor 14, and support 60 may then correspond to image sensor 14 or to a protection layer covering the image sensor. According to another embodiment, angular filter 16 is formed separately from image sensor 14. Angular filter 16 is then subsequently affixed to image sensor 14, for example, by lamination. The thickness of substrate 60 is then preferably smaller than 50 μm, and substrate 60 is at least partially transparent to the wavelengths of interest to be measured by image sensor 14.

Figure 12:
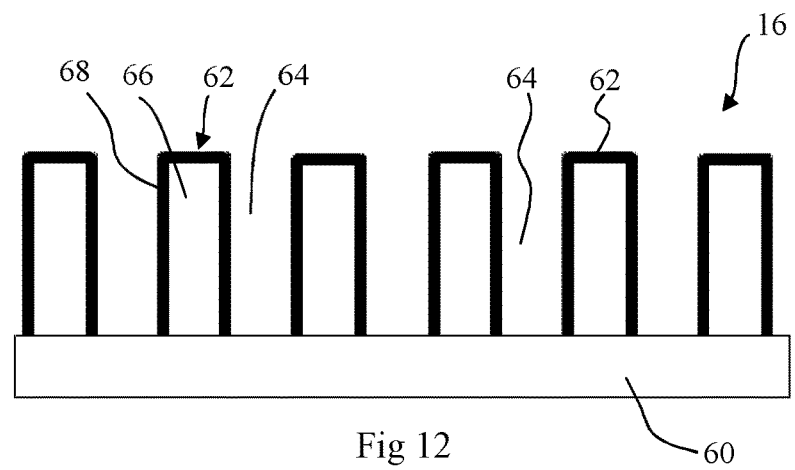
FIGS. 12 to 17 are partial simplified cross-section views of other embodiments of an angular filter.

FIG. 12 is a partial simplified cross-section view of an alternative embodiment of walls 62 of the angular filter 16 shown in FIGS. 10 and 11 where each wall 62 comprises a core 66 made of a first material at least partly transparent to the radiation detected by image sensor 14 and covered with a layer 68 opaque to the radiation detected by photodetectors 28, for example absorbing and/or reflective with respect to the radiation detected by photodetectors 28. The first material may be a resin. The second material may be a metal, for example, aluminum (Al) or chromium (Cr), a metal alloy, or an organic material.

An embodiment of a method of manufacturing the angular filter 16 shown in FIGS. 10 and 11 comprises the step of:

deposition of a transparent resin layer on support 60, for example, by spin coating or by slot die coating;

printing of the patterns of walls 62 in the resin layer by photolithography;

development of the resin layer to only keep cores 66 of walls 62; and forming of layer 68 on cores 66, particularly by a selective deposition, for example, by evaporation, of the second material on cores 66 only, or by deposition of a layer of the second material on cores 66 and on support 60 between cores 66 and by removal of the second material present on support 60.

Figure 13:
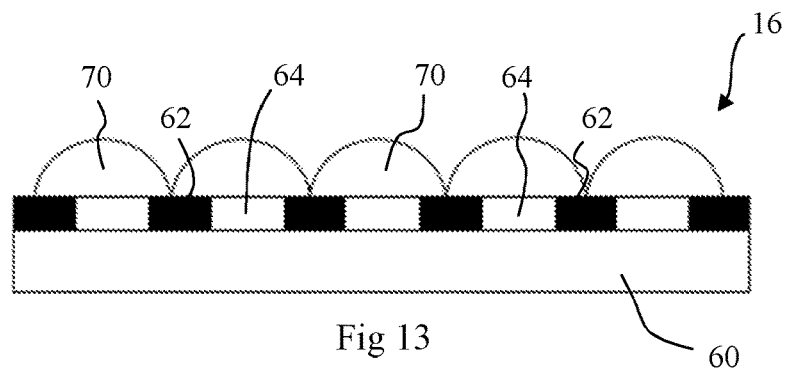

FIG. 13 is a partial simplified cross-section view of another embodiment of angular filter 16. Angular filter 16 comprises the structure shown in FIGS. 10 and 11 and further comprises, for each hole 64, a microlens 70 resting on the tops of walls 62 and covering hole 64.

Each microlens 70 advantageously enables to increase the collection of rays of the incident radiation having an incidence smaller than a desired maximum angle of incidence but which would be blocked by the surfaces of walls of 62 in the absence of microlens 70. Such an embodiment is particularly adapted to applications where the light level is low, such as the capture of digital fingerprints through display screen 52. Microlenses 70 may be made of silica or of PMMA. The filling material of holes 64 may be the same as the material forming microlenses 70.

The pitch of microlenses 70 may be the same as the pitch of photodetector 28 or smaller. In the presence of microlenses 70, holes 64 of angular filter 16 essentially act as an optical micro-diaphragm between microlenses 70 and image sensor 14 so that there is less constraint on the aspect ratio w/h of holes 64 with respect to the case where microlenses 70 are not present. The maximum angle of incidence is determined by width w of holes 64 and the curvature of microlenses 70.

Figure 14:
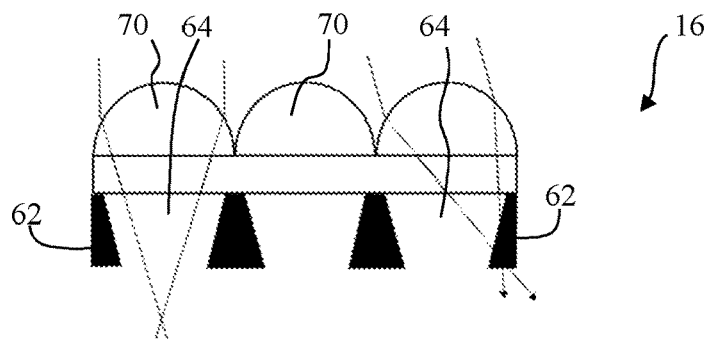

FIG. 14 is a partial simplified cross-section view of a variation of the embodiment shown in FIG. 13 where the cross-section of holes 64 is not constant, the cross-section decreasing as the distance from microlenses 70 increases. The left-hand portion of FIG. 14 shows light rays in normal incidence, which are not blocked by angular filter 16, and the right-hand portion of FIG. 14 shows light rays in oblique incidence, which are blocked by angular filter 16.

Figure 15:
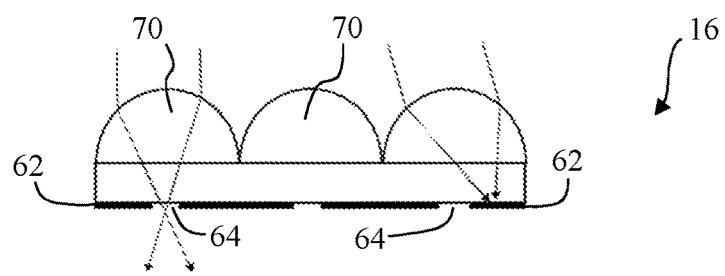

FIG. 15 is a partial simplified cross-section view of a variation of the embodiment shown in FIG. 13 where walls 62 are formed in a thin layer located substantially at the level of the focal plane of the microlenses so that each hole 64 is substantially centered on the focus of the associated microlens 70. The left-hand portion of FIG. 15 shows light rays in normal incidence, which are not blocked by angular filter 16, and the right-hand portion of FIG. 15 shows light rays in oblique incidence, which are blocked by angular filter 16. Such openings arranged in (or close to) the focal plane enables to maintain the angular selectivity of the filter without decreasing the effective sensitivity of the pixel by a decrease of its active surface area.

An embodiment of a method of manufacturing the angular filter 16 shown in FIG. 14 or 15 comprises the steps of:

forming microlenses on the upper surface of a transparent support, particularly by printing techniques;

forming a layer of a positive resist on the lower surface of the support; and forming holes 64 in the layer by exposure of the resist to light collimated through the mask formed by microlens array 70 and removing the exposed portions of the resin.

This embodiment enables to automatically align microlenses 70 with holes 64.

Figure 16:
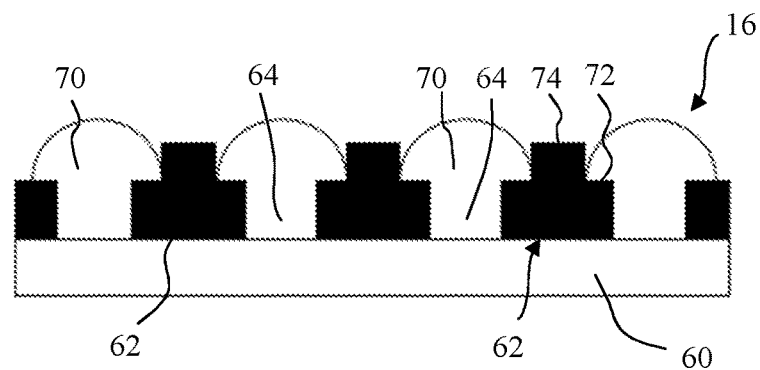

FIG. 16 is a partial simplified cross-section view of a variation of the embodiment shown in FIG. 13 where walls 62 comprise edges 72 having microlenses 70 resting thereon and comprise end portions 74 which extend from edges 72 between microlenses 70. This enables to decrease the crosstalk between neighboring microlenses 70.

Figure 17:
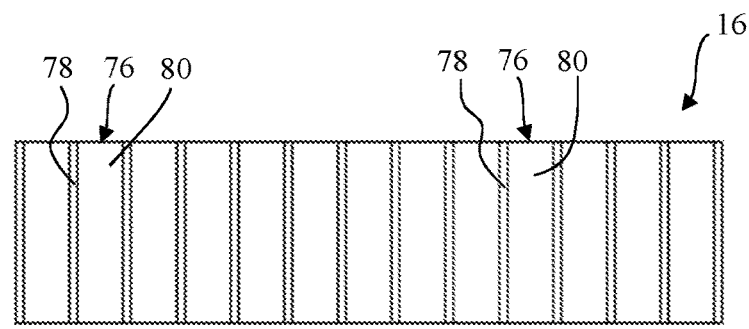

FIG. 17 is a partial simplified cross-section view of another embodiment of angular filter 16 where angular filter 16 comprises an optical fiber plate. The optical fiber plate comprises optical fibers 76 having substantially parallel optical axes oriented parallel to the axis of the rays of zero incidence detected by image sensor 14. The core 78 of each optical fiber 76 is made of a first material transparent to the radiation detected by image sensor 74. The sheath 80 of each optical fiber 76 surrounds core 78 and is made of a material having a refraction index smaller than that of core 78. The sheaths 78 of optical fibers 76 may form a monoblock structure.

Figure 18:
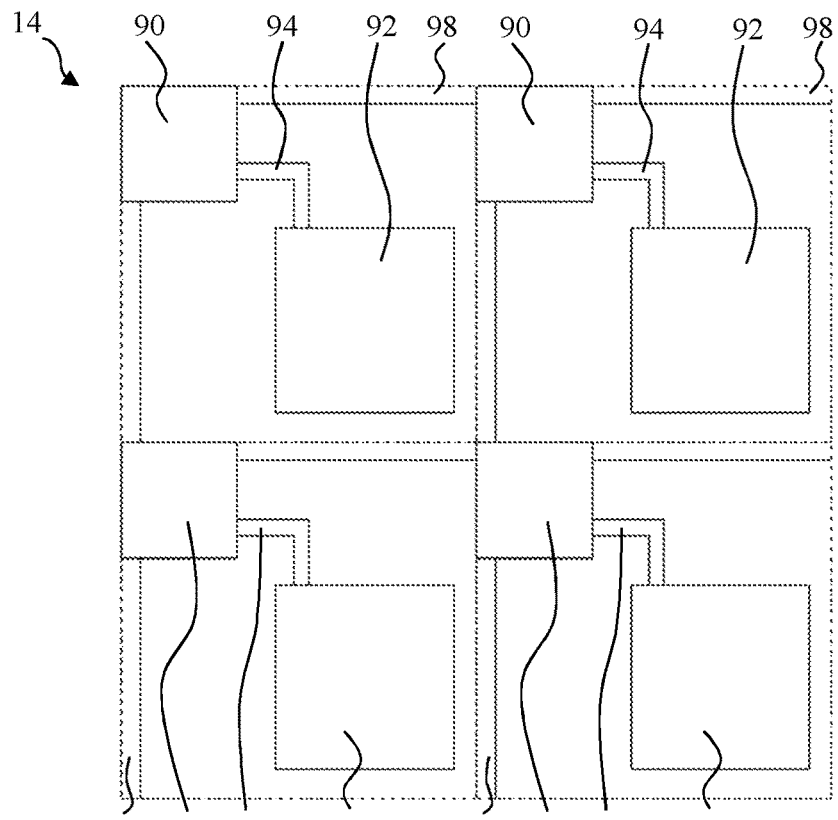
FIG. 18 is a partial simplified top view of another embodiment of a display system comprising a display screen and an image sensor.

FIG. 18 is a top view of a more detailed embodiment of image sensor 14 where each photodetector 28 corresponds to a photodiode and where image sensor 14 comprises a selection element 90 associated with each photodiode 28.

Selection element 90 may correspond to a transistor, for example, a transistor made of amorphous silicon, a low-temperature polysilicon transistor (LTPS), an indium gallium zinc oxide transistor (IGZO), or an organic field effect transistor (OFET), particularly an organic thin film transistor (OTFT).

One of the terminals among the source and the drain of transistor 90 is connected to a lower electrode 92 of the photodiode by a connection element 94 and the other terminal among the source and the drain is connected to a conductive track 96. Each conductive track 96 may be connected to all the transistors 90 of a same column. The gate of each transistor 90 may be controlled by a signal transmitted by a conductive track 98. Each conductive track 98 may be connected to all the transistors 90 of a same row.

Figure 19:
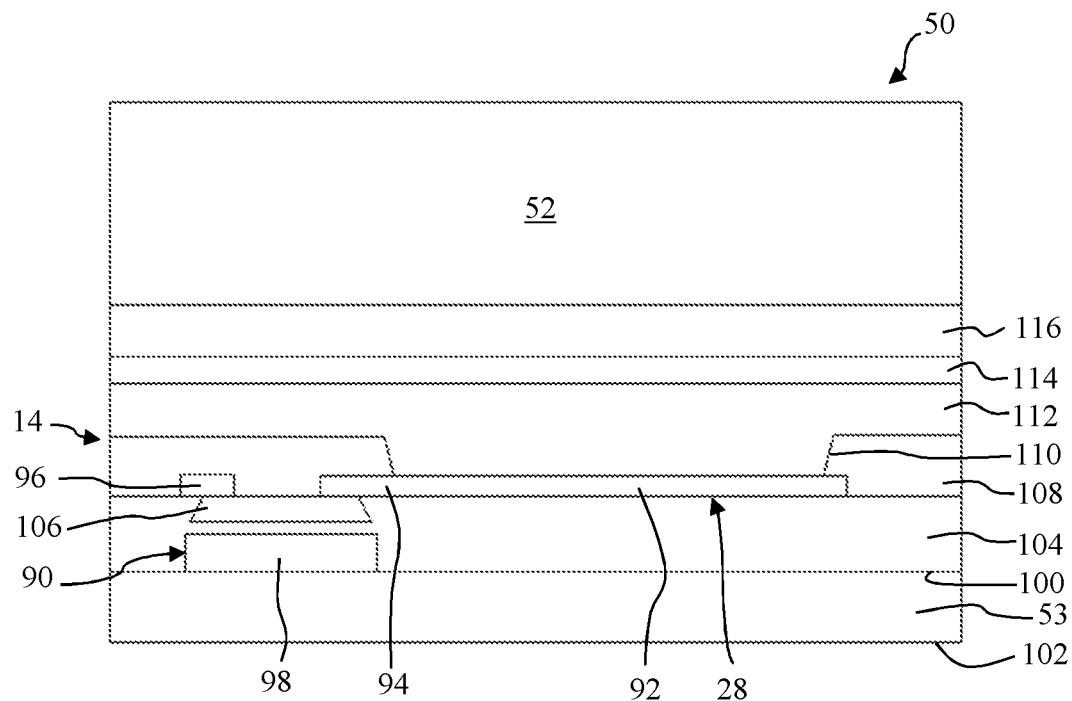
FIG. 19 is a partial simplified top view of a more detailed embodiment of the image sensor of the display system of FIG. 18.

FIG. 19 is a cross-section view of a more detailed embodiment of display system 50 comprising the image sensor 14 shown in FIG. 18. Only one photodetector 28 and the associated selection element 90 are shown in FIG. 19. Display screen 52 is not shown in detail in FIG. 19.

Image sensor 14 successively comprises, from bottom to top in FIG. 19:

support 53 comprising two opposite surfaces 100, 102;

track 98 resting on surface 100 of support 53;

a stack 104 of insulating layers particularly covering track 98;

a semiconductor portion 106, having the drain and source regions of transistor 90, separated from the associated track 98 by stack 104 of insulating layers, formed therein;

connection element 94 and conductive track 96 extending on stack 104 of insulating layers;

an electrically-insulating layer 108 covering semiconductor portion 106 and conductive track 96 and comprising an opening 110 exposing a portion of connection element 94;

an active layer 112 covering insulating layer 108 and in contact with connection element 94 through opening 110, the portion of connection element 94 in contact with active layer 112 forming lower electrode 92 of photodetector 28;

an electrically-conductive layer 114 covering active layer 112 and forming the upper electrode of photodetector 28; and an adhesive layer 116 covering electrically-conductive layer 114.

The angular filter is not shown in FIG. 19.

In the present embodiment, active layer 112 and upper electrode 114 are common to all photodetectors 28. The active area of each photodetector 28 which corresponds to the area where most of the incident radiation is absorbed and converted into an electric signal by photodetector 28 substantially corresponds to the portion of active layer 112 located between lower electrode 92 and upper electrode 114.

Support 57 may be made of a dielectric material. Support 57 is for example a rigid support, particularly made of glass, or a flexible support, for example, made of polymer or of a metallic material. Examples of polymers are polyethylene naphthalene (PEN), polyethylene terephthalate (PET), polyimide (PI), and polyetheretherketone (PEEK). The thickness of support 57 is for example in the range from 20 µm to 1 cm, for example, approximately 125 µm.

Conductive tracks 96, 98 and connection element 94 may be made of a metallic material. Conductive tracks 96, 98 and connection element 94 may have a single-layer or multilayer structure.

Conductive track 114 is at least partially transparent to the light radiation originating from display screen 52. Conductive layer 114 may be made of a conductive and transparent material, for example, of transparent conductive oxide or TCO, of carbon nanotubes, of graphene, of a conductive polymer, of a metal, or of a mixture or an alloy of at least two of these compounds. Conductive layer 114 may have a monolayer or multilayer structure.

Examples of TCOs capable of forming conductive layer 114 are indium tin oxide (ITO), aluminum zinc oxide (AZO), and gallium zinc oxide (GZO). Examples of conductive polymers capable of forming conductive layer 114 are the polymer known as PEDOT:PSS, which is a mixture of poly(3,4)-ethylenedioxythiophene and of sodium poly (styrene sulfonate), and polyaniline, also called PAni. Examples of metals capable of forming conductive layer 114 are silver (Ag), aluminum (Al), gold (Au), copper (Cu), nickel (Ni), titanium (Ti), and chromium (Cr). An example of a multilayer structure capable of forming conductive layer 114 is a multilayer AZO and silver structure of AZO/Ag/AZO type.

The thickness of conductive layer 114 may be in the range from 10 nm to 5 µm, for example, in the order of 30 nm. In the case where conductive layer 114 is metallic, the thickness of conductive layer 114 is smaller than or equal to 20 nm, preferably smaller than or equal to 10 nm.

Dielectric layer 108 and/or each layer of stack 104 may be made of a fluorinated polymer, particularly the fluorinated polymer commercialized under trade name Cytop by Bellex, of polyvinylpyrrolidone (PVP), of polymethyl methacrylate (PMMA), of polystyrene (PS), of parylene, of polyimide (PI), or of a mixture of at least two of these compounds. As a variation, dielectric layer 108 and/or each layer of stack 104 may be made of an inorganic dielectric, particularly of silicon nitride (SiN) or of silicon oxide (SiOx). The maximum thickness of each dielectric layer 104, 108 may be in the range from 50 nm to 2 µm, for example, in the order of 200 nm.

Active layer 112 may comprise small molecules, oligomers, or polymers. These may be organic or inorganic materials. Active layer 112 may comprise an ambipolar semiconductor material, or a mixture of an N-type semiconductor material and of a P-type semiconductor material, for example in the form of stacked layers or of an intimate mixture at a nanometer scale to form a bulk heterojunction. The thickness of active layer 112 may be in the range from 50 nm to 2 µm, for example, in the order of 500 nm.

Example of P-type semiconductor polymers capable of forming active layer 40 are poly(3-hexylthiophene) (P3HT), poly[N-9'-heptadecanyl-2,7-carbazole-alt-5,5-(4,7-di-2-thienyl-2',1',3'-benzothiadiazole)] (PCDTBT), poly[(4,8-bis-(2-ethylhexyloxy)-benzo[1,2-b;4,5-b'] dithiophene)-2,6-diyl-alt-(4-(2-ethylhexanoyl)-thieno[3,4-b] thiophene))-2,6-diyl] (PBDTTT-C), poly[2-methoxy-5-(2-ethyl-hexyloxy)-1,4-phenylene-vinylene] (MEH-PPV), or poly[2,6-(4,4-bis-(2-ethylhexyl)-4H-cyclopenta [2,1-b;3,4-b']dithiophene)-alt-4,7(2,1,3-benzothiadiazole)] (PCPHOTODETECTORBT).

Examples of N-type semiconductor materials capable of forming active layer 112 are fullerenes, particularly C60, [6,6]-phenyl-$C_{61}$-methyl butanoate ([60]PCBM), [6,6]-phenyl-$C_{71}$-methyl butanoate ([70]PCBM), perylene diimide, zinc oxide (ZnO), or nanocrystals enabling to form quantum dots.

Active layer 112 may be interposed between first and second interface layers, not shown. The first interface layer enables to align the work function of electrode 92 or 114 with the electronic affinity of the acceptor material used in active layer 112. The first interface layer may be made of cesium carbonate ($CSCO_3$), of metal oxide, particularly of zinc oxide (ZnO), or of a mixture of at least two of these compounds. The first interface layer may comprise a self-assembled monomolecular layer or a polymer, for example, (polyethyleneimine, ethoxylated polyethyleneimine, poly [(9,9-bis(3'-(N,N-dimethylamino)propyl)-2,7-fluorene)-alt-2,7-(9,9-dioctylfluorene)]. The second interface layer enables to align the work function of the other electrode 92 or 114 with the ionizing potential of the donor material used in active layer 112. The second interface layer may be made of copper oxide (CuO), of nickel oxide (NiO), of vanadium oxide ($V_2O_5$), of magnesium oxide (MgO), of tungsten oxide ($WO_3$), or of a mixture of at least two of these compounds. According to the photodiode polarization mode, the interface layers ease the collection, the injection, or the blocking of charges from the electrodes into active layer 112. The thickness of each interface layer is preferably in the range from 0.1 nm to 1 µm.

Adhesive layer 116 enables to affix image sensor 14 to display screen 52. Adhesive layer 116 may be made of a dielectric material. Layer 116 may have a thickness in the range from 1 µm to 100 µm, for example, 15 µm. As an example, conductive layer 116 corresponds to an epoxy glue. According to another example, adhesive layer 116 corresponds to a pressure-sensitive adhesive or PSA.

Figure 20:
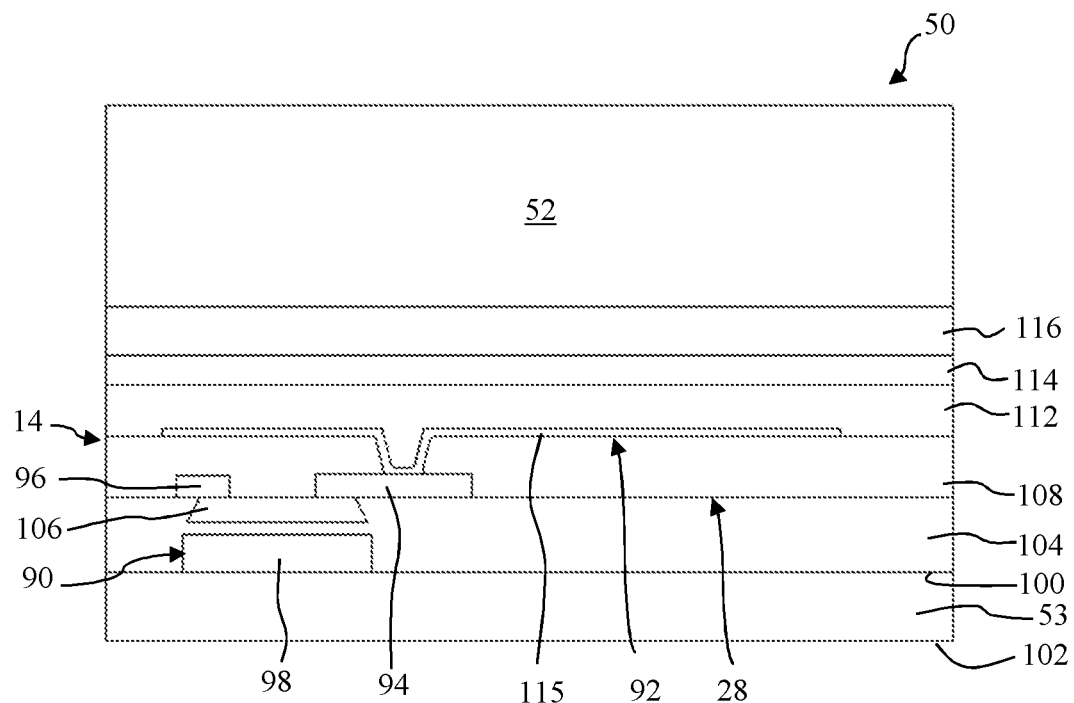
FIGS. 20 to 22 are partial simplified cross-section views of embodiments of a display system comprising a display screen and an image sensor.

FIG. 20 is a cross-section view similar to FIG. 19 of another more detailed embodiment of display system 50 comprising the image sensor 14 shown in FIG. 18. Image sensor 14 comprises the same elements as for the embodiment shown in FIG. 19, with the difference that connection element 94 is not in direct contact with active layer 112, image sensor 14 comprising, for each photodetector 28, an electrically-conductive layer 117 playing the role of a lower electrode, resting on insulating layer 108 in contact with active layer 112 and in contact with connection element 94 through opening 110. Advantageously, the contact surface between lower electrode 115 and active layer 112 may be greater than the contact surface between connection element 94 and active layer 112 in the embodiment shown in FIG. 19.

According to an embodiment, image sensor 14 may comprise a protection layer, for example, made of a dielectric material, interposed between upper electrode 114 and adhesive layer 116.

According to an embodiment, image sensor 14 may comprise means for filtering the incident radiation according to the incidence of the radiation relative to protection layer 18 of display screen 52, particularly so that each photodetector 28 only receives the radiation having an incidence relative to an axis perpendicular to protection layer 18 of display screen 52 smaller than 45°, preferably smaller than 30°. This advantageously enables to decrease the noise of the signal delivered by each photodetector 28. According to an embodiment, the filtering means may comprise an array of pinholes covering the array of photodetectors 28. According to another embodiment, the filtering means may comprise an array of lenses, for example Fresnel lenses. According to another embodiment, the filtering means may comprise an array of optical fibers having parallel axes oriented substantially perpendicularly to surface 19 of display screen 52, the array of optical fibers covering the array of photodetectors 28.

Figure 21:
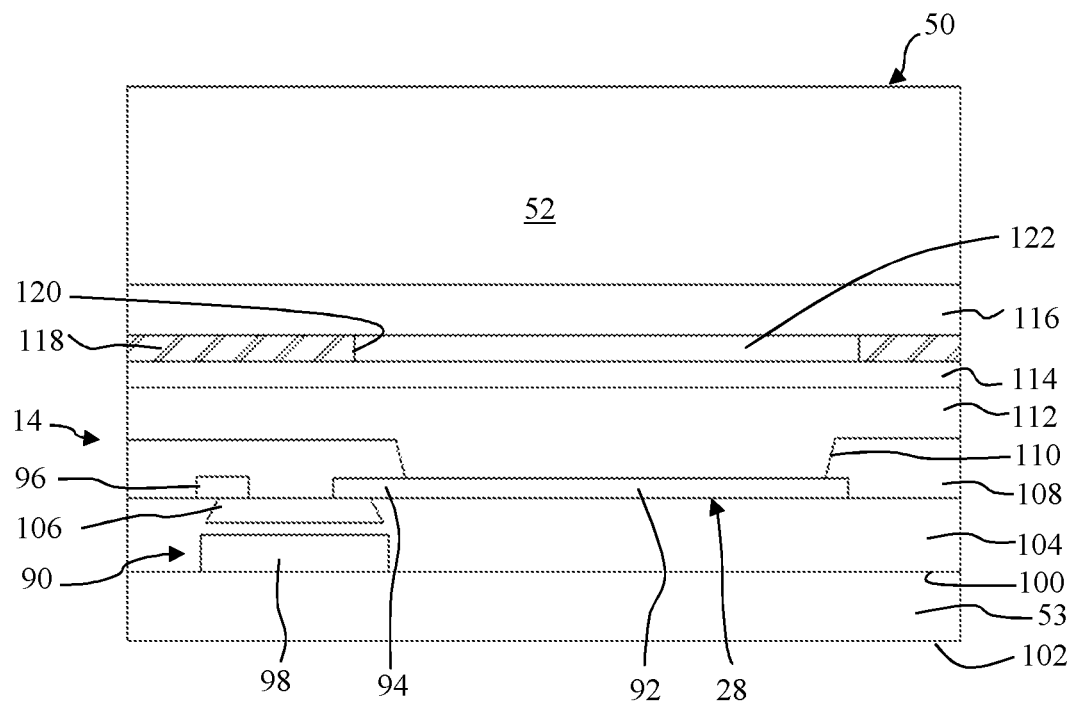

FIG. 21 is a cross-section view similar to FIG. 19 of another more detailed embodiment of display system 50 comprising the image sensor 14 shown in FIG. 18. Image sensor 14 comprises the same elements as for the embodiment shown in FIG. 19 and further comprises a layer 118 of a material opaque to the radiation detected by photodetectors 28 and comprising, for each photodetector 28, an opening 120 filled with a material 122 at least partially transparent to the radiation detected by photodetectors 28.

According to an embodiment, image sensor 14 may comprise means for filtering the incident radiation according to the wavelength interposed between display screen 52 and active layer 112. It may be a filter capable of giving way to the radiation originating from the actuation member to be detected over the wavelength range detected by photodetectors 28.

Figure 22:
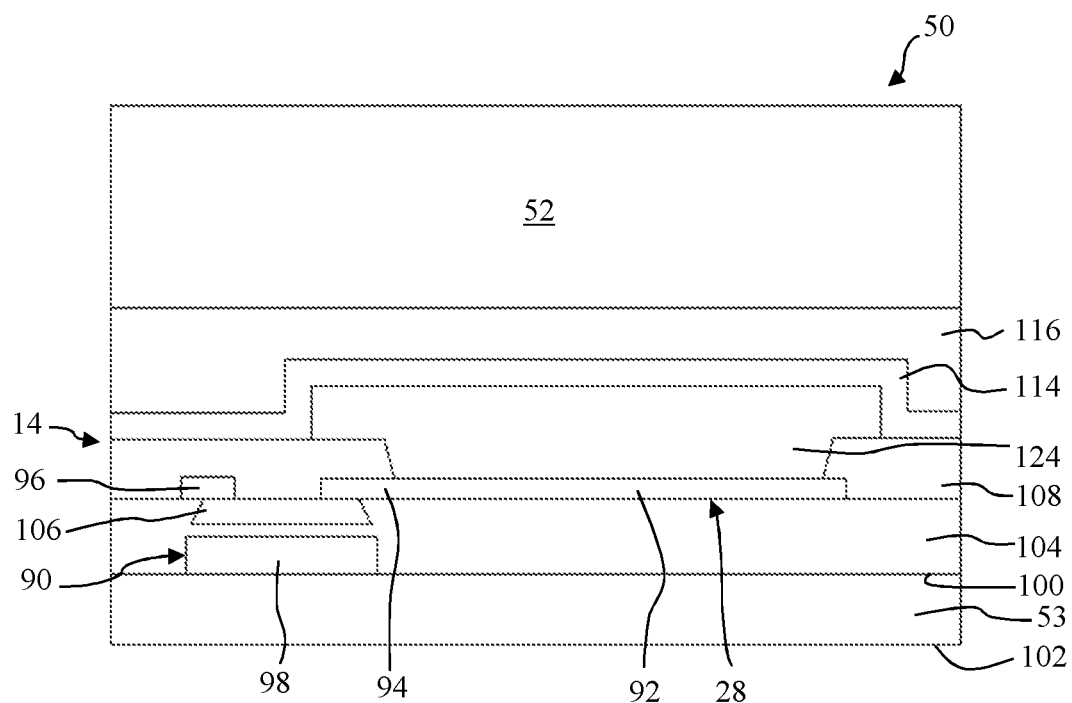

FIG. 22 is a cross-section view similar to FIG. 19 of another more detailed embodiment of display system 50 comprising the image sensor 14 shown in FIG. 18. Image sensor 14 comprises the same elements as for the embodiment shown in FIG. 19, with the difference that active layer 112 is replaced, for each detection pixel, with an active portion 124. This enables to suppress risks of optical crosstalk that could be observed with the embodiment described in FIG. 19. All the active portions 120 may have the same composition as active layer 112. As a variation, active portions 120 may have different compositions and be capable of detecting light radiations at different wavelengths.

In the embodiments previously described in relation with FIGS. 19 to 22, transistors 90 are bottom gate transistors since the tracks 98 forming the gates of transistors 90 are interposed between support 53 and semiconductor portions 106. According to another embodiment, transistors 90 may be top gate transistors for which the semiconductor portions 106 of transistors 90 are interposed between support 53 and the tracks 98 forming the gates.

According to an embodiment, the method of manufacturing display system 50 comprises manufacturing display screen 52, manufacturing image sensor 14, and affixing image sensor 14 to display screen 52 with adhesive layer 116.

Advantageously, the method of manufacturing display system 50 enables to directly reuse conventional display screen and/or image sensor structures. Further, display screen 52 and image sensor 14 being formed separately, the image sensor element manufacturing steps do not interfere with the steps of manufacturing the elements of the display screen and/or the other way around. Further, the display screen and the image sensor may comprise electronic components of same nature, particularly transistors, which may be designed to respond to different operating constraints for the display screen and for the image sensor.

According to the considered materials, the method of forming the layers of image sensor 14 may correspond to a so-called additive process, for example, by direct printing of the material forming the organic layers at the desired locations, particularly in sol-gel form, for example, by inkjet printing, photogravure, silk-screening, flexography, spray coating, or drop casting. According to the considered materials, the method of forming the layers of image sensor 14 may correspond to a so-called subtractive method, where the material forming the organic layers is deposited all over the structure and where the non-used portions are then removed, for example, by photolithography or laser ablation. Further, according to the considered layers and materials, the material forming the organic layers is deposited over the entire structure and may be left in place, the pitch of photodetectors 28 being then obtained by the position of electrodes 92. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used. When the layers are metallic, the metal is for example deposited by evaporation or by cathode sputtering over the entire support and the metal layers are delimited by etching.

Advantageously, at least some of the layers of image sensor 14 may be formed by printing techniques. The materials of the previously-described layers may be deposited in liquid form, for example, in the form of conductive and semiconductor inks by means of inkjet printers. "Materials in liquid form" here also designates gel materials capable of being deposited by printing techniques. Anneal steps may be provided between the depositions of the different layers, but it is possible for the anneal temperatures not to exceed 150° C., and the deposition and the possible anneals may be carried out at the atmospheric pressure.

Specific embodiments have been described. Various alterations and modifications will occur to those skilled in the art. In particular, the previously-described angular filter 16 may further be used to collimate the radiation that crosses it. Further, the angular filter may be used as a polarizing filter, the filter being formed by perforation of a polarizing film or being formed on a polarizing layer. When the radiation reaching the angular filter is polarized, for example, linearly, the polarization direction of the polarizing film is selected to be different from the polarizing direction of the radiation so that the radiation is substantially blocked by the polarizing filter. Further, although in the previously described embodiments, a field-effect transistor is associated with each light-emitting component, it should be clear that two or more than two field-effect transistors may be associated with each light-emitting component. Similarly, although in the previously-described embodiments, a field-effect transistor is associated with each photodetector of the image sensor, it should be clear that two or more than two field-effect transistors may be associated with each photodetector. Various embodiments with different variations have been described hereabove. It should be noted that those skilled in the art may combine these various embodiments and variations without showing any inventive step. In particular, the angular filters described in relation with FIGS. 10 to 17 may be implemented with the image acquisition system 10 shown in FIG. 1, the image acquisition system 25 shown in FIG. 2, the image acquisition system 40 shown in FIG. 4 or the display system shown in FIG. 7. Further, the filtering layer 118 described in relation with FIG. 21 may also be used with the embodiments described in relation with FIGS. 20 and 22.

The invention claimed is:

1. An image acquisition system comprising:
   a source of a radiation;
   a display screen, the source being confounded with the display screen or being separate from the display screen;
   an image sensor comprising an array of photodetectors capable of detecting said radiation and comprising a first surface;
   an angular filter, covering the image sensor and interposed between the display screen and the image sensor, and capable of blocking the rays of said radiation having an incidence relative to a direction orthogonal to the first surface greater than a threshold and of giving way to rays of said radiation having an incidence relative to a direction orthogonal to the first surface smaller than the threshold; and
   a coating at least partially transparent to said radiation and covering the image sensor, the angular filter being interposed between the coating and the image sensor;
   wherein said radiation is in the visible range and/or in the infrared range; and
   wherein the angular filter comprises an array of holes delimited by walls opaque to said radiation or made of a polarizing material, the holes being filled with air or with a material at least partially transparent to said radiation.

2. The image acquisition system of claim 1, wherein the source is capable of emitting said radiation into the coating from the periphery of the coating, the coating playing the role of a waveguide for said radiation.

3. The image acquisition system of claim 1, wherein, for each hole, the ratio of the height of the hole, measured perpendicularly to the first surface, to the width of the hole, measured parallel to the first surface, varies from 1 to 10.

4. The image acquisition system of claim 1, wherein the holes are arranged in rows and in columns, the pitch between adjacent holes of a same row or of a same column varying from 10 µm to 30 µm.

5. The image acquisition system of claim 1, wherein the height of each hole, measured along a direction orthogonal to the first surface, varies from 1 µm to 1 mm.

6. The image acquisition system of claim 1, wherein the width of each hole, measured parallel to the first surface, varies from 5 µm to 30 µm.

7. The image acquisition system of claim 1, wherein the walls are opaque to said radiation and wherein the walls are entirely made of a material opaque to said radiation.

8. The image acquisition system of claim 1, wherein the walls are opaque to said radiation and wherein each wall comprises a core made of a material transparent to said radiation covered with a layer opaque to said radiation.

9. The image acquisition system of claim 1, further comprising lenses covering the holes.

10. The image acquisition system of claim 9, comprising, for each hole, a lens covering the hole and in contact with the walls.

11. The image acquisition system of claim 1, wherein the photodetectors comprise organic photodiodes.

12. The display system of claim 1, wherein the display screen comprises an array of light-emitting components and wherein the photodetectors are offset with respect to the light-emitting components along a direction perpendicular to the first surface.

13. The display system of claim 12, wherein the light-emitting components are separated from one another by intermediate areas and wherein the photodetectors are located in line with said intermediate areas along a direction perpendicular to the first surface.

14. The display system of claim 13, wherein the transmittance of the display screen to the radiation emitted by the light-emitting components is greater than 5% along paths perpendicular to said first surface and running through the intermediate areas.

15. The display system of claim 1, wherein the display screen comprises an array of light-emitting components, wherein the light-emitting components are at least partly transparent to the radiation, and wherein the light-emitting components are located at least partly opposite the photodetectors along a direction perpendicular to the first surface.

16. The display system of claim 12, wherein the light-emitting components comprise organic light-emitting diodes.

17. The display system of claim 1, wherein the display screen comprises a second surface for image display and the image sensor is affixed to the display screen by an adhesive layer on the side of the display screen opposite to the second surface.

18. The display system of claim 1, wherein the image sensor comprises a filter of the radiation emitted by the light-emitting components according to the wavelength between the array of photodetectors and the display screen.

19. The display system of claim 1, wherein the image sensor comprises a selection element for each photodetector, the photodetectors being located between the selection elements and the display screen.

20. The display system of claim 1, wherein the display screen comprises an array of light-emitting components and wherein the dimensions of the array of photodetectors seen in a plane parallel to said first surface are equal, to within 10%, to the dimensions of the array of light-emitting components seen in said plane.

21. A use of the display system of claim 1 for the detection of at least one fingerprint of a user.

22. The use of claim 21, wherein the image sensor is further used as a touch surface.

23. A method of manufacturing an image acquisition system comprising the steps of:
   providing a source of a radiation and a display screen, the source being confounded with the display screen or being separate from the display screen;
   forming an image sensor comprising an array of photodetectors capable of detecting said radiation and comprising a surface; and
   forming an angular filter, covering the image sensor and interposed between the display screen and the image sensor, and capable of blocking the rays of said radiation having an incidence relative to a direction orthogonal to the surface greater than a threshold and of giving way to rays of said radiation having an incidence relative to a direction orthogonal to the surface smaller than the threshold;

forming a coating at least partially transparent to said radiation and covering the image sensor, the angular filter being interposed between the coating and the image sensor;

wherein said radiation is in the visible range and/or in the infrared range; and wherein the angular filter comprises an array of holes delimited by walls opaque to said radiation or made of a polarizing material, the holes being filled with air or with a material at least partially transparent to said radiation.

24. The method of claim 23, wherein the walls are opaque to said radiation, the forming of the angular filter comprising the steps of:

forming a layer of a resist; and forming the walls by etching of the layer by photolithography.

25. The method of claim 24, wherein the resist is a black or colored resin.

26. The method of claim 23, wherein the walls are opaque to said radiation, the forming of the angular filter comprising the steps of:

forming a transparent resin mold, by photolithography steps, having a shape complementary to the desired shape of the walls;

filling the mold with the material forming the walls; and removing the obtained structure from the mold.

27. The method of claim 23, wherein the walls are opaque to said radiation, each wall comprising a core made of a material transparent to said radiation covered with a layer opaque to said radiation, the forming of the angular filter comprising the steps of:

forming a layer of a resist transparent to said radiation;

etching the layer by photolithography according to the desired shape of the walls; and covering the obtained structure with the layer opaque to said radiation.

28. The method of claim 23, wherein the forming of the angular filter comprises piercing holes of micrometer-range size in a black or colored film.

29. The method of claim 28, wherein the holes are pierced by means of needles of micrometer-range size.

* * * * *